(12) United States Patent
Mosley et al.

(10) Patent No.: US 7,176,575 B2
(45) Date of Patent: Feb. 13, 2007

(54) INPUT/OUTPUT ROUTING ON AN ELECTRONIC DEVICE

(75) Inventors: Larry E. Mosley, Santa Clara, CA (US); Cengiz A. Palanduz, Chandler, AZ (US); Victor Prokofiev, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 68 days.

(21) Appl. No.: 10/955,944

(22) Filed: Sep. 30, 2004

(65) Prior Publication Data

US 2006/0065975 A1    Mar. 30, 2006

(51) Int. Cl.
*H01L 23/48* (2006.01)

(52) U.S. Cl. .............................. 257/760; 257/E23.079
(58) Field of Classification Search ......... 257/E23.079
See application file for complete search history.

(56) References Cited

U.S. PATENT DOCUMENTS

| 5,783,461 | A  | * | 7/1998 | Hembree ..................... 438/17 |
| 6,072,690 | A  | * | 6/2000 | Farooq et al. ........... 361/321.2 |
| 6,222,269 | B1 | * | 4/2001 | Usami ........................ 257/758 |
| 6,255,737 | B1 | * | 7/2001 | Hashimoto .................. 257/784 |
| 2002/0088977 | A1 | * | 7/2002 | Mori et al. .................... 257/68 |

* cited by examiner

*Primary Examiner*—Lex H. Malsawma

(57) ABSTRACT

An electronic device includes a material having a first dielectric constant (K) value, and a material having a second dielectric constant (K) value. The first dielectric constant (K) value is lower than the second dielectric constant (K) value. The electronic device also includes input/output connection conductors for transmitting signals to and from a die. The input/output connection conductors are routed through the material of the interposer having the first dielectric constant. The electronic device also includes power connection conductors for delivering power to the die, and ground connection conductors. The power and ground connection conductors are routed through the material having the second dielectric constant.

31 Claims, 8 Drawing Sheets

INPUT/OUTPUT ROUTING ON AN ELECTRONIC DEVICE

BACKGROUND OF THE INVENTION

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of hundreds (or even thousands) of MIPS (millions of instructions per second), to be packaged in relatively small, air-cooled semiconductor device packages. As integrated circuit devices, microprocessors and other related components are designed with increased capabilities and increased speed, more input/output or transmission lines are typically needed. In addition, the decreased size of the microprocessor typically results in more closely spaced input/output lines. The emphasis on increased speed and performance requires increased speed for switching on the input/output lines. In addition, little if any cross-talk between the input/output lines is desired. Also, efficient power delivery to a semiconductor is desired.

BRIEF DESCRIPTION OF THE DRAWINGS

The invention is pointed out with particularity in the appended claims. However, a more complete understanding of the present invention may be derived by referring to the detailed description when considered in connection with the figures, and:

The description set out herein illustrates the various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 1:
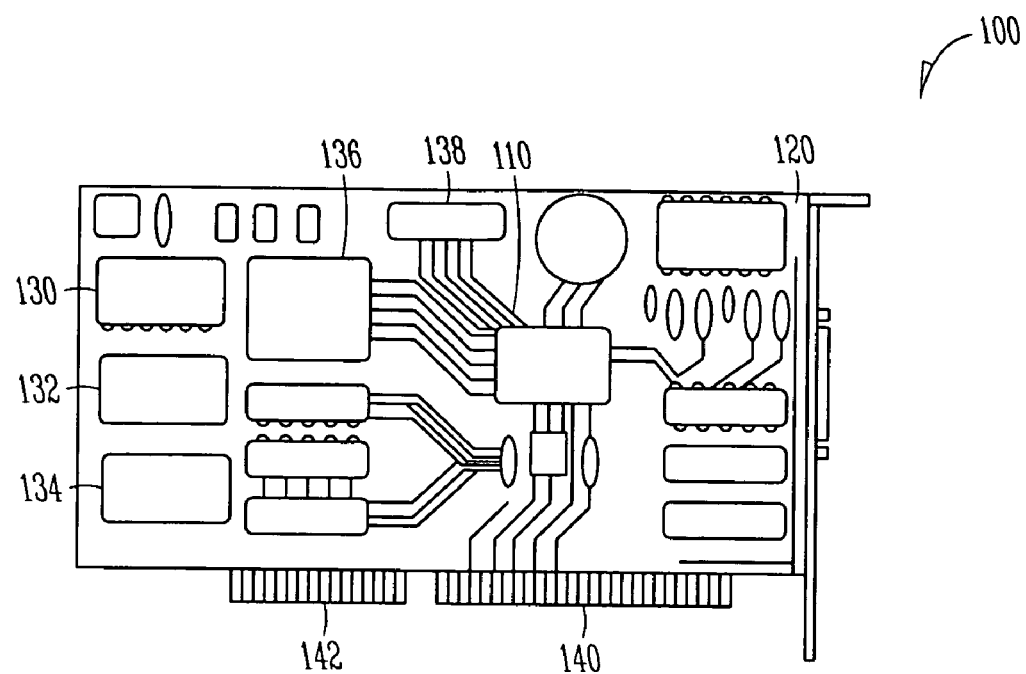
FIG. 1 is a top view of a printed circuit board having a component with input/output lines passing through a material having a first dielectric constant, and having power and ground lines passing through a second dielectric constant, according to an example embodiment.

FIG. 1 is a top view of a printed circuit board 100 having a component 136 formed according to an example embodiment. The printed circuit board 100 is a multi-layer plastic board that includes patterns of printed circuits on one or more layers of insulated material. The patterns of conductors correspond to wiring of an electronic circuit formed on one or more of the layers of the printed circuit board 100. The printed circuit board 100 also includes electrical traces 110. The electrical traces 110 can be found on an exterior surface 120 of the printed circuit board 100 and also can be found on the various layers within the printed circuit board 100. Printed circuit boards also include through holes (not shown in FIG. 1) which are used to interconnect traces on various layers of the printed circuit board 100. The printed circuit board 100 can also include planes of metallized materials such as ground planes, power planes, or voltage reference planes (not shown in FIG. 1).

The printed circuit board 100 is also populated with various components 130, 132, 134, and 138. The components 130, 132, 134, 136, and 138 can either be discrete components or semiconductor chips which include thousands or millions of transistors. The components 130, 132, 134, 136, 138 can use any number of technologies to connect to the exterior surface 120 of the printed circuit board 100. For example, pins may be inserted into plated through holes or pins may be extended through the printed circuit board 100. An alternative technology is surface mount technology, where an electrical component, such as component 136, mounts to an array of pads on the exterior surface 120 of the printed circuit board 100. For example, component 136 could be a ball grid array package or device that has an array of balls or bumps that interact or are connected to a corresponding array of pads on the exterior surface 120 of the printed circuit board 100. The printed circuit board 100 can also include connectors 140, 142 for making external connections to other electrical or electronic devices. The component 136 includes a first set of conductors routed through a material having a first dielectric constant (K) value, and a second set of conductors routed through a material having a second dielectric constant (K) value. The first dielectric constant (K) value is lower than the second dielectric constant (K) value. Example embodiments of component 136 are set forth below. It is contemplated that the printed circuit board 100 can include one or more components, such as component 136.

As shown in FIG. 1, the printed circuit board 100 includes a first edge connector 140 and a second edge connector 142. As shown in FIG. 1 there are external traces, such as electrical trace 110, on the external surface 120 of the printed circuit board 100 that connect to certain of the outputs associated with the first edge connector 140. Other traces that connect with the edge connectors 140, 142 may have traces internal to the printed circuit board 100. The printed circuit board 100 can be a motherboard, a daughterboard, a sound card, a video card, a modem, or any other type of board or card for use in any type of product, including a computing product or system.

Figure 2:
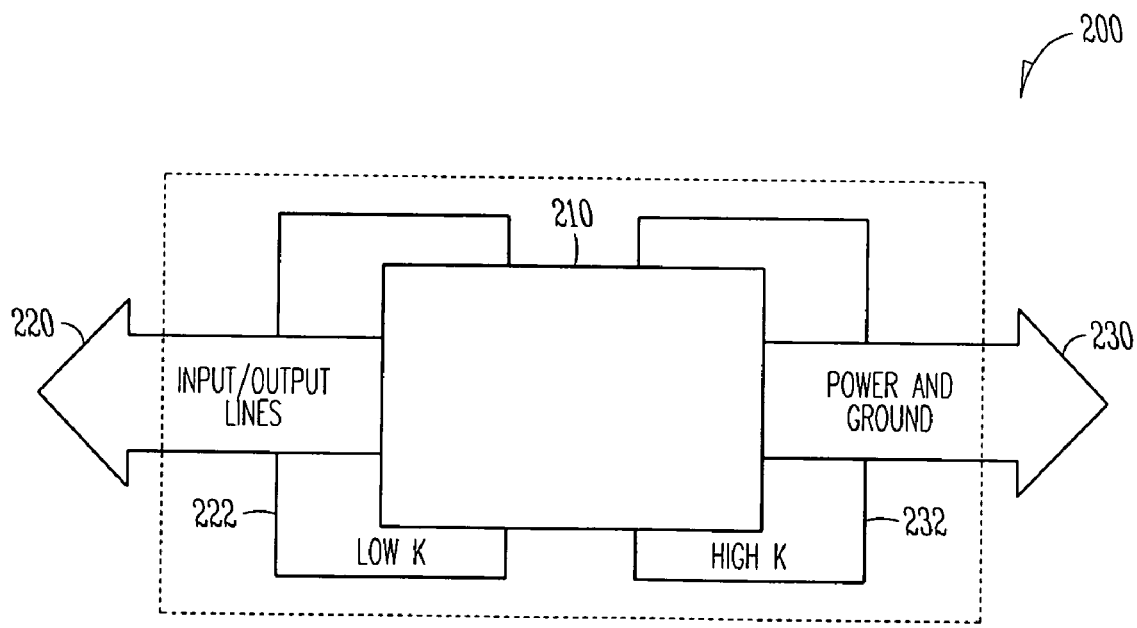
FIG. 2 illustrates a schematic diagram of a die having input/output lines passing through a material having a first dielectric constant, and having power and ground lines passing through a second dielectric constant, according to an example embodiment.

FIG. 2 illustrates a schematic diagram of a die 210 that is part of a package 200, according to an example embodiment. The package 200 is similar to the component 136 shown in FIG. 1. The die 200 includes a first set of conductors 220 passing through a material 222 having a first dielectric constant. The package also includes a second set of conductors 230 passing through a material 232 having a second dielectric constant. As shown, the first set of conductors 220 include signal lines or input/output lines, and the second set of conductors 230 includes power conductors and connections to ground. The input/output lines or first set of conductors 220 pass through a lower dielectric constant material than the power and ground conductors or second set of conductors 230. The dielectric constant is the relative permittivity of a given material compared to the permittivity of vacuum or air. The dielectric constant reflects the relative ability of a given material to store electrostatic energy (per given volume) to that of air.

The material 232 having a higher value for the dielectric constant is labeled as high K material, and the material 222 having a lower value for the dielectric constant is labeled as low K material. In one example embodiment the low K material has a dielectric constant in the range of 2–4, and the high K material has a dielectric constant in the range of 2000–7000. In another embodiment of the invention the high K material has a dielectric constant in the range of 300–5000. In an example embodiment, the ratio of the dielectric constant of the high K material 232 to the dielectric constant of the low K material 222 is in the range of 150 to 3500. In another example embodiment, the ratio of the dielectric constant of the high K material 232 to the dielectric constant of the low K material 222 is in the range of 750 to 2000. In still another example embodiment, the ratio of the dielectric constant of the high K material 232 to the dielectric constant of the low K material 222 is in the range of 950 to 1050. In general, the set of conductors 230, namely power and ground conductors, passing through the high K material 232 will short high frequency between the conductors within the set of conductors 230. This is desirable since this will also short voltage variations that may occur between power and ground. The set of conductors 220 passing through the low K material 222 prevents high frequencies from being transmitted between signal lines, and prevents high frequencies from being transmitted from a signal line to a conductor carrying power or connected to ground.

Figure 3:
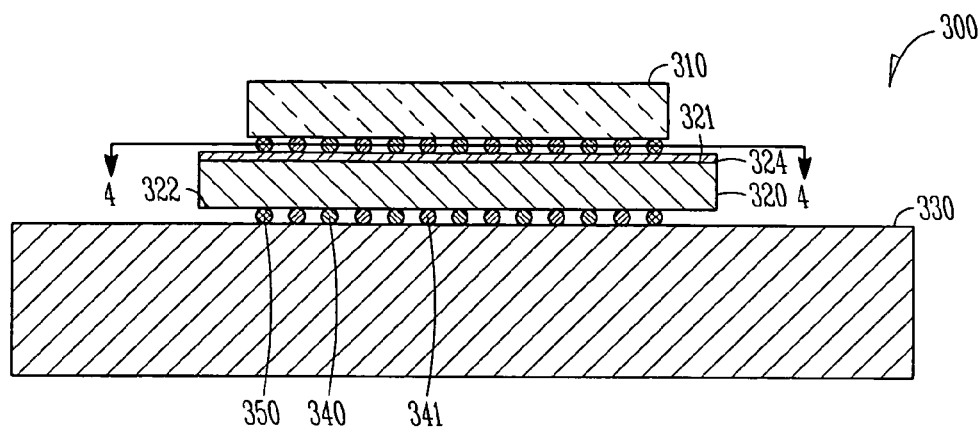
FIG. 3 illustrates a cross-sectional side view of a package that includes a die, a ceramic interposer and a package substrate, according to an example embodiment.

FIG. 3 illustrates a cross-sectional side view of a package 300 that includes a die 310, a ceramic interposer 320 and a package substrate 330, according to an example embodiment. The interposer 320 is a device including a number of conductive paths that is positioned between the package substrate 330 and the die 310. The interposer 320 includes a first major surface 321 and a second major surface 322, and has connection pads on each of the first major surface 321 and the second major surface 322. The connections passing through the interposer 320 include conductors 340 for power and conductors 341 to connect to ground as well as conductors 350 for carrying signals to and from the die 310. The conductors 340 for power and conductors 341 to connect to ground, are generally paired so that one of the conductors carries current in a positive direction and the other carries current in a negative direction.

Figure 4:
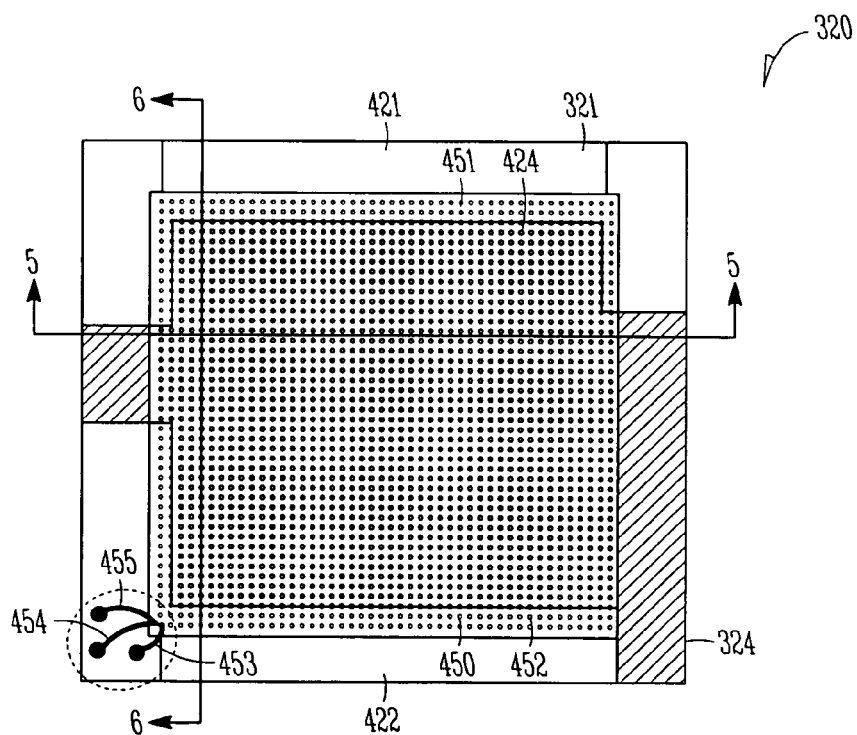
FIG. 4 illustrates a cross-sectional top view of the package along line 4—4 of FIG. 3, according to an example embodiment.

FIG. 4 illustrates a cross-sectional top view of package 300 along line 4—4 of FIG. 3. The resultant view is of the interposer 320 of the package 300. Now referring to both FIGS. 3 and 4, the interposer 320 of the package 300 also includes a material having a first dielectric constant (K) value, and a material having a second dielectric constant (K) value. The first dielectric constant (K) value is lower than the second dielectric constant (K) value. A layer of high K material 324 is positioned on at least portions of the first major surface 321 of the interposer 320. A set 424 of conductors 340 for carrying power and conductors 341 connected to ground are routed through the high K material 324. The high K material shorts high frequencies between the conductors 340 for carrying power and the conductors 341 connected to ground. This is desirable since this will also prevent or substantially reduce voltage variations or parasitic signals that may occur between the conductors 341 carrying power and conductors 341 connected to ground in the set 424 of conductors. The package 300 also includes another set 450 of conductors that carry signals. In some embodiments, the signal lines are also arranged in pairs and form transmission lines. As shown in FIG. 4, the set 450 of conductors includes a first subset 451 of conductors and a second subset 452 of conductors that are routed through low K material 421 and low K material 422, respectively. At least a portion on the first major surface 321 of the interposer 320 includes the low K material 421 and low K material 422. At least some of the signal-carrying conductors 453, 454, 455 of the subset 452 of conductors are routed over the low K material 422.

Figure 5:
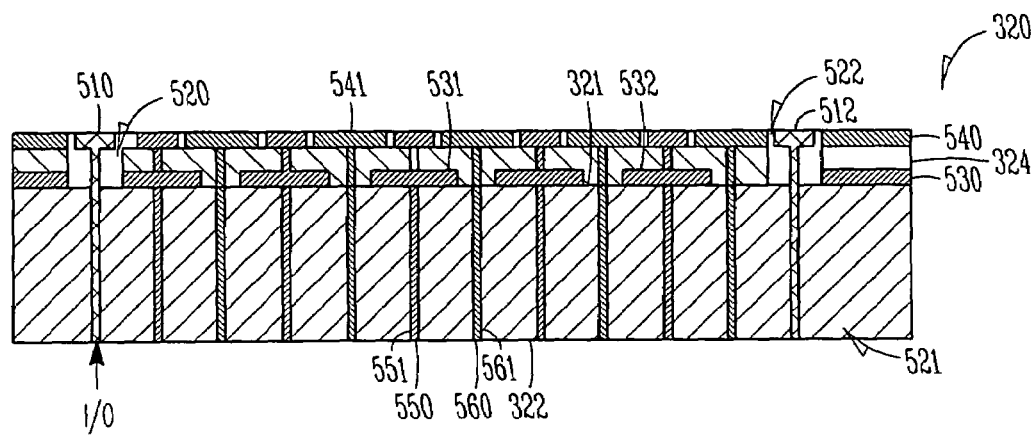
FIG. 5 illustrates a cut-away side view of the interposer along line 5—5 in FIG. 4, according to an example embodiment.

FIG. 5 illustrates a cut-away side view of the interposer 320 along line 5—5 in FIG. 4, according to an example embodiment. FIG. 5 shows two signal-carrying or I/O (input/output) conductors 510, 512 associated with the subset 451 of conductors. The I/O conductors 510, 512 are surrounded by a low K material 520, 522, respectively. The interposer 320 has a main body portion 521 made of a ceramic material. The main body portion 521 includes the first major surface 321 and the second major surface 322. The high K material 324 is placed on the first major surface 321. A bottom metal 530 is initially placed on the first major surface 321. Portions of the bottom metal 530 are removed to leave plates 532. In one embodiment, the portions of the bottom metal 530 are removed using photolithography to place a pattern on photoresist. Either the unexposed or exposed portions of the photoresist are removed so that a pattern of plates is positioned over the layer of bottom metal 530. The surface can then be etched to expose portions of the first major surface 321. Next the high K material 324 is applied to the first major surface 321 of the interposer 320. The high K material can be a dielectric or ceramic. In one embodiment, the high K material 324 includes perovskite (calcium titanium oxide) or another crystalline mineral. In other embodiments, the high K material may be barium titanate, zirconium titanate, tantalum pentoxide ($Ta_2O_5$), oxynitride film ($SiONx$ film), barium titanate ($BaTiO_3$) or barium strontium titanate (BST) or other materials exhibiting a high dielectric constant (K) or any high K material exhibiting a high dielectric constant (K). The high K material 324, in another embodiment, can includes a thin-film or thick-film dielectric layer deposited over a conductive plate. In various embodiments, a high K material is sputter deposited, anodically grown, deposited by chemical solution deposition (CSD) or deposited by chemical vapor deposition (CVD).

A top metal 540 is then placed on the high K material 324. Plates 541 are also formed in the top layer using photolithography techniques or similar techniques. A via 551 is then formed through plate 541, the high K material 324, and through the main body portion 521 of the interposer 320. The via 551 is provided with a conductive surface to form a power connector or conductor 550. Similarly, a via 561 is formed through the high K material 324, through plate 531, and through the main body portion 521 The via 561 is provided with a conductive surface to form a ground connection or conductor 560. As formed, a major planar surface of the plate 531 of the ground conductor 560 is positioned near a major planar surface of the plate 541 of the power conductor 550. Placing the major planar surface of the plate 531 near the major planar surface of the plate 541 enhances the capacitive coupling between the power conductor 550 and the ground conductor 560 to aid in filtering out of high frequency perturbations or voltage variations between the ground and power conductors.

Figure 6:
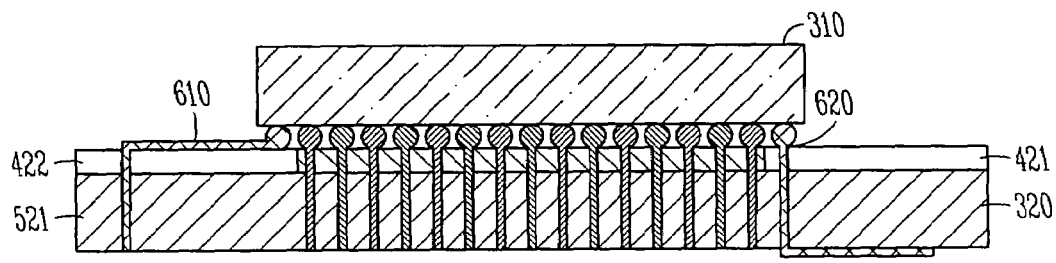
FIG. 6 illustrates a cut-away side view of the interposer along line 6—6 in FIG. 4, according to an example embodiment.

FIG. 6 illustrates a cut-away side view of the interposer 320 along line 6—6 in FIG. 4, according to an example embodiment. FIG. 6 shows the routing of a first signal-carrying or I/O conductor 610, and the routing of a second signal-carrying or I/O conductor 620 associated with the first subset of conductors 451 and the second subset of conductors 452 (as shown in FIG. 4). The periphery of the ceramic interposer 320 is devoid of high K material. As shown in FIGS. 4 and 6, the I/O conductor 610 is routed through the low K material 422 positioned on the first major surface 321 of the interposer 320. The I/O conductor 610 is routed over the low K material 422 and then through the layer of low K material 422 and through the main body portion 521 of the interposer 320. The I/O conductor 620 is routed through the layer of low K material 421 and then through the main body portion 521 of the interposer 320.

Figure 7:
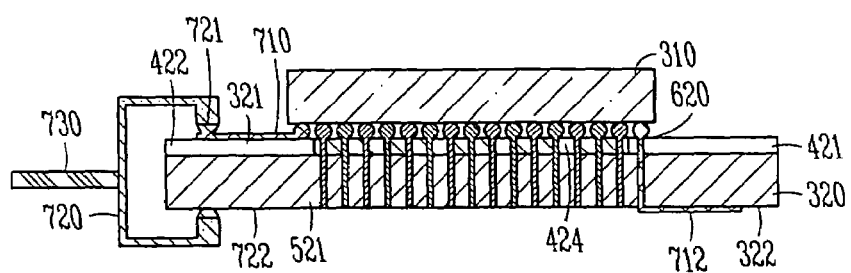
FIG. 7 illustrates a cut-away side view of the ceramic interposer connected to a flexible substrate, according to an example embodiment.

FIG. 7 illustrates a cut-away side view of a ceramic interposer 320 and a flexible substrate 730 attached to the signal-carrying or I/O lines, such as an I/O line 710, according to an example embodiment. The flexible substrate 730 is made of a low K material such as an organic material such as a polyimide, teflon), and the like. As shown in FIG. 7, the perimeter of the ceramic interposer 320 includes a portion of low K material 422. The low K material 422 is placed on the first major surface 321 of the ceramic interposer 320. The I/O line 710 is placed on the low K material 422. The I/O line carries a signal from the perimeter of the die 310 to an area closer to the perimeter of the ceramic interposer 320. The flex material or flexible substrate 730 may be attached to the I/O line 710 with a C-shaped connector 720. The C-shaped connector 720 includes a coupling portion 721 which couples the I/O line 710 to the C-shaped connector 720. The C-shaped connector 720 also includes a conductor for carrying the signal from the I/O line 710 to the flexible substrate 730. The C-shaped connector 720 also is made of a low K material to prevent cross talk between conductors that carry signals through the C-shaped connector 720. The C-shaped connector also includes another contact portion 722 for making connections to I/O lines, such as an I/O line 712, that terminates at or on the second major surface 322 of the ceramic interposer 320.

Figure 8:
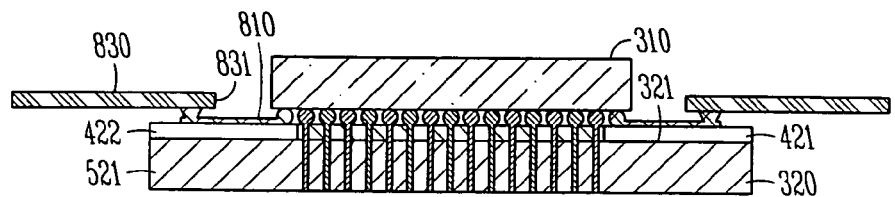
FIG. 8 illustrates a cut-away side view of the ceramic interposer connected to a flexible substrate, according to an example embodiment.

FIG. 8 illustrates another embodiment of a ceramic interposer 320 attached to a flexible substrate 830, according to an example embodiment. The flexible substrate 830 is made from a low K material and includes conductors that correspond to various I/O lines that are routed or terminate near the outer perimeter of the ceramic interposer 320. The ceramic interposer 320 includes a main body portion 521 which is made of ceramic and also includes a region 421 and a region 422 near the perimeter of the first major surface 321 of the ceramic interposer 320 which includes a low K material. An I/O line such as I/O line 810 is placed atop the low K material 422. The I/O line includes a conductor that routes signals from the die 310 over the low K material 422 and to a position near the perimeter of the ceramic interposer. A flexible substrate 830 is connected to the I/O line 810 near the perimeter of the ceramic interposer 320. The flexible substrate 830 includes a connector 831 which connects to the end or near the end of the I/O line 810. The flexible substrate is made of a low K material and includes a conductor or conductors for carrying the signal that is either carried from the die 310 or to the die 310 over the I/O line 810. The flexible substrate 830 can include connections to other components or to outputs or inputs as part of an electronic system.

Figure 9:
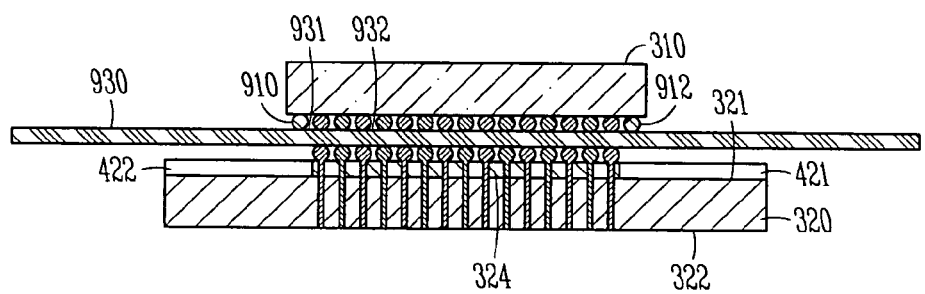
FIG. 9 illustrates a cut-away side view of the ceramic interposer connected to a flexible substrate, according to an example embodiment.

FIG. 9 illustrates a cutaway side view of a ceramic interposer 320 connected to a flexible substrate 930, according to another example embodiment. The ceramic interposer 320 includes a first major surface 321, and a second major surface 322. The die 310 includes a plurality of C4-type ball connectors for power and connections to ground as well as for signal-carrying. As shown in FIG. 9, the C4-type ball or bump 910 and a C4-type ball or bump 912 are positioned on the outside or perimeter of the die 310 and carry signals to and from the die 310. The flexible substrate 930 includes conductors which attach to these I/O or signal-carrying C4-type ball connectors 910, 912. The flexible substrate 930 is made of a low K material so as to prevent cross talk between adjacent signal-carrying lines or between the signal-carrying line and a nearby power or ground connection. The flexible substrate also includes a number of connectors that pass directly through the flexible substrate, such as conductors 931 and 932. The flexible substrate is made of a low K material and therefore there is little or no capacitive coupling between the conductor 931 and the conductor 932 within the flexible substrate 930. The ceramic interposer 320 is provided with a high K material portion 324, which is placed on the first major surface 321 of the ceramic interposer 320. Capacitive coupling between the power and ground conductors occurs in the region having the high K material 324. In this particular embodiment, the C4-type connector or balls 910, 912 that carry or transmit I/O signals connect directly to the flexible substrate 930. The flexible substrate 930 also includes conductors such as 931 and 932 for directly connecting a power connection to a conductor within the ceramic interposer 930 or a ground connection from the die 310 to a ground conductor passing through the ceramic interposer 320.

Figure 10:
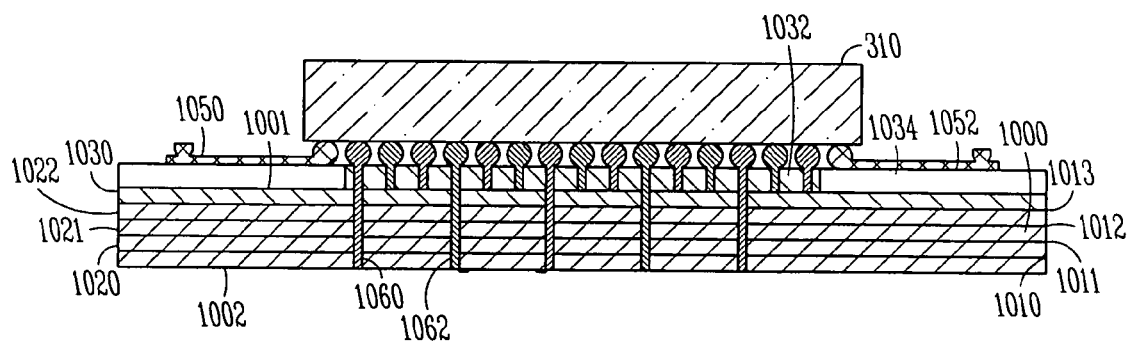
FIG. 10 illustrates a cut-away side view of a die attached to an array capacitor, according to an example embodiment.

FIG. 10 illustrates a cutaway side view of a die 310 attached to an array capacitor 1000, according to an example embodiment. The array capacitor 1000 includes a series of conductive layers 1010, 1011, 1012, 1013, which are separated by insulative layers 1020, 1021, 1022. The conductive layer 1010 and the conductive layer 1012 are attached to one of either the ground connections or the power connections while the conductive layers 1011 and 1013 are attached to the other of the power connections or ground connections. The insulative layers are very thin. In some embodiments, the insulative layers are as thin as one to two microns. The array capacitor formed includes metal layers 1010, 1011, 1012, 1013 that have capacitive coupling between the metal layers and therefore the array capacitor 1000 is formed as a high K material with capacitive coupling between the metal layers 1010, 1011, 1012, 1013. The array capacitor 1000 also includes a spacing layer 1030. The array capacitor includes a first major surface 1001 and a second major surface 1002. A layer of high K material 1032 is positioned on a portion of the first major surface 1001 of the array capacitor 1000. A low K material 1034 is placed about the perimeter or at least a portion of the perimeter of the first major surface 1001 of the array capacitor 1000. The high K material 1032, which is on the first major surface 1001 of the array capacitor 1000, is roughly in the shape of the connectors associated with the die 310 that carry power to and from the die as well as connections for ground also associated with the die 310. I/O signal-carrying lines are placed on the surface of the low K material 1034. As shown in FIG. 10, a first I/O line 1050 and a second I/O line 1052 are placed on top of the low K material 1024. The I/O lines 1050, 1052 provide a conductive path from the outer perimeter of the die 310 to a position near the outer perimeter of the array capacitor 1000. The I/O signal-carrying contacts of the die 310 are positioned as bumps on the outer perimeter or near the outer perimeter of the die 310. The bumps associated with power and ground connections are positioned within the I/O bumps on the die 310. The high K material 1032 placed on the first major surface 1001 is positioned to correspond to the position of the power and ground bumps of the die. Conductors for transporting power, such as a conductor 1060, pass through the high K material 1032 as well as through the array capacitor 1000. Similarly, a ground connector, such as a connector 1062, passes through the high K material 1032 as well as the array capacitor 1000. The power and ground connections, such as power connection 1060 and ground connection 1062 are capacitively coupled by passing through the high K material 1032 as well as the high K material formed by the array capacitor. The metal layers 1010, 1011, 1012, 1013 act as plates attached to a set of power connectors or a set of ground connectors and provide capacitive coupling between the power and ground connections.

Figure 11:
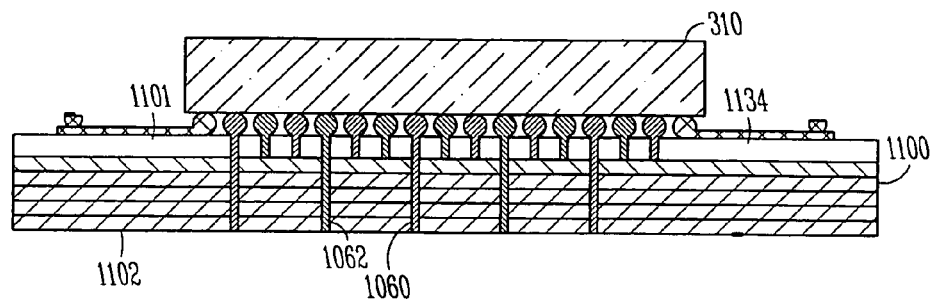
FIG. 11 illustrates a cut-away side view of a die attached to an array capacitor, according to another example embodiment.

FIG. 11 illustrates a cutaway side view of a die 310 attached to an array capacitor 1100. The array capacitor 1100 includes a first major surface 1101 and a second major surface 1102. The embodiment shown in FIG. 11 differs from the embodiment shown in FIG. 10 in that the first major surface 1101 of the array capacitor 1100 has a low K material 1134 positioned over substantially the entire first major surface 1101 of the array capacitor 1100 rather than having a high K material positioned between the between the die 310 and the array capacitor 1100, and on the first major surface 1101 near the balls or bumps that are used for power and ground connections to and from the die 310. The array capacitor 1110 is termed a high K material. The array capacitor 1100 includes a power connection, such as a power connection 1060, and a ground connection, such as a ground connection 1062. The array capacitor 1100 that is formed provides sufficient capacitive coupling between the power and ground connections 1060, 1062, respectively, to prevent or substantially reduce voltage variations or parasitic signals between power and ground, even in the absence of another high K material on the first major surface 1101 of the thin film capacitor. The I/O lines are routed over the low K material 1134 in a similar fashion to that shown and discussed in FIG. 10.

Figure 12:
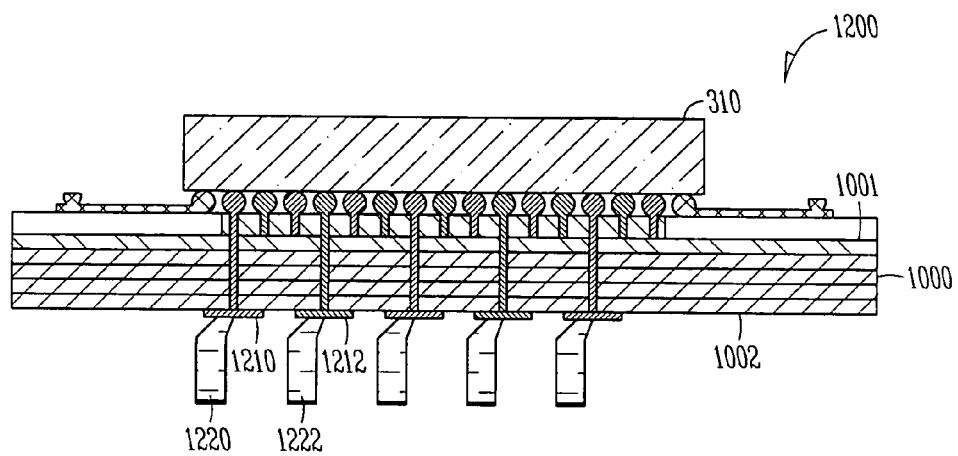
FIG. 12 illustrates a cut-away side view of a die attached to an array capacitor with socket contacts connected to the power and ground contacts of the array capacitor, according to an example embodiment.

FIG. 12 illustrates a cutaway side view of a die 310 attached to an array capacitor 1000, according to another example embodiment. The array capacitor 1000 includes a first major surface 1001 and a second major surface 1002. In this example embodiment, the array capacitor 1110 is termed a high K material. The second major surface includes a set of electrical pads, such as an electrical pad 1210 associated with a power connector and a pad 1212 associated with a ground connector. Attached to the pad 1210 and 1212 are a socket contact 1220 and a socket contact 1222, respectively. As a result, the device 1200 as shown can be placed on to a circuit board (such as circuit board 100 shown in FIG. 1) using the socket contact, such as the socket contacts 1220 and 1222.

Figure 13:
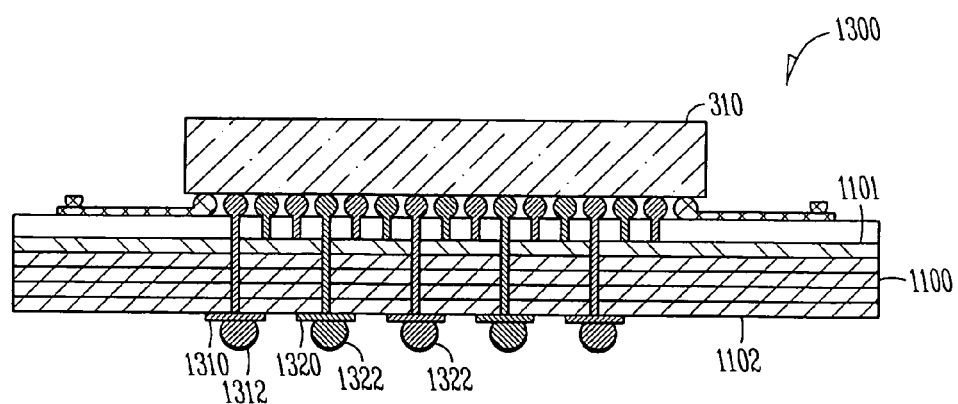
FIG. 13 illustrates a cut-away side view of a die attached to an array capacitor with ball contacts connected to the power and ground contacts of the array capacitor, according to an example embodiment.

FIG. 13 illustrates a cutaway side view of a die 310 attached to an array capacitor 1100, according to an example embodiment. The array capacitor 1100 has a first major surface 1101 and a second major surface 1102. In this example embodiment, the array capacitor 1110 is termed a high K material. On the second major surface 1102 are a series of pads, such as a pad for a power connection 1310, and a pad for a ground connection 1320. Formed on the pads are bumps or balls, such as a ball or bump 1312 associated with the pad 1310 and the ball or bump 1322 associated with the pad 1320. As a result, the device 1300 that includes the die 310 and the array capacitor 1100 can be attached to a printed circuit board 100 (see FIG. 1) on a set of corresponding pads on the printed circuit board 100. In other words, the device 1300 is a ball grid array type of device and can be surface mounted to the printed circuit board 100 (see FIG. 1).

Figure 14:
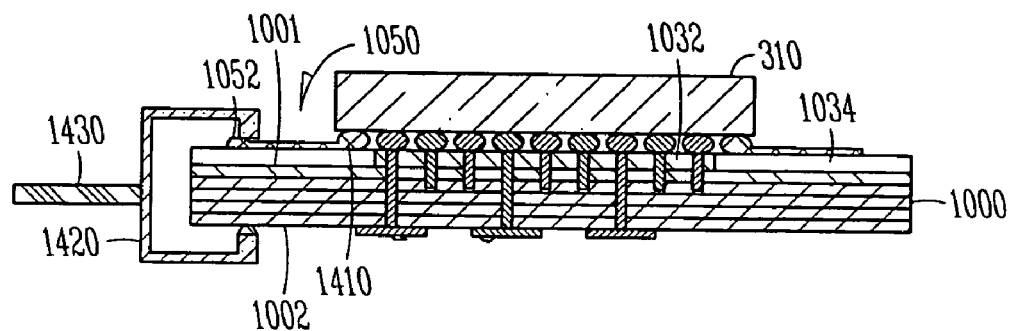
FIG. 14 illustrates a cut-away side view of a die attached to an array capacitor with a flexible substrate connected to the input/output lines, according to an example embodiment.

FIG. 14 illustrates a cutaway side view of a die 310 attached to an array capacitor 1000 with a flexible substrate 1430 connected to an I/O line 1050, according to an example embodiment. The I/O line 1050 includes an I/O pad 1052 near the perimeter of the array capacitor 1000. The I/O line 1050 passes over the surface of a low K material 1034 and provides a conductive path between an I/O contact 1410 associated with the die 310 and the I/O pad 1052. The flexible substrate 1430 is connected to the I/O pad 1052 by way of a C-shaped clamp 1420. Both the C-shaped clamp 1420 and the flexible substrate 1430 are made of or include low K material, so as to prevent cross talk or conductance between other nearby I/O lines either within the connector 1420 and the within the flexible substrate 1430, or in another structure including another C-shaped connector and another flex substrate. The C-shaped connector 1420 can include one or more conductive paths from the I/O pad 1052. The flexible substrate 1430 can also include one or more electrical paths. The electrical paths within the C-shaped connector 1420 and the flexible substrate 1430 provide a conductive path for the signals being carried by the conductors, such as I/O conductor 1050. As mentioned previously, the power and ground connections are capacitively coupled by the high K material 1032 on the surface of the array capacitor 1000. The high K material may include a thin film capacitor. In addition, the power and ground connections are capacitively coupled within the array capacitor 1000. The array capacitor 1000 is yet another high K material. The various plates associated with the array capacitor 1000 (structure detailed and discussion of FIG. 10) enhance the capacitive coupling between the power and ground connectors.

Figure 15:
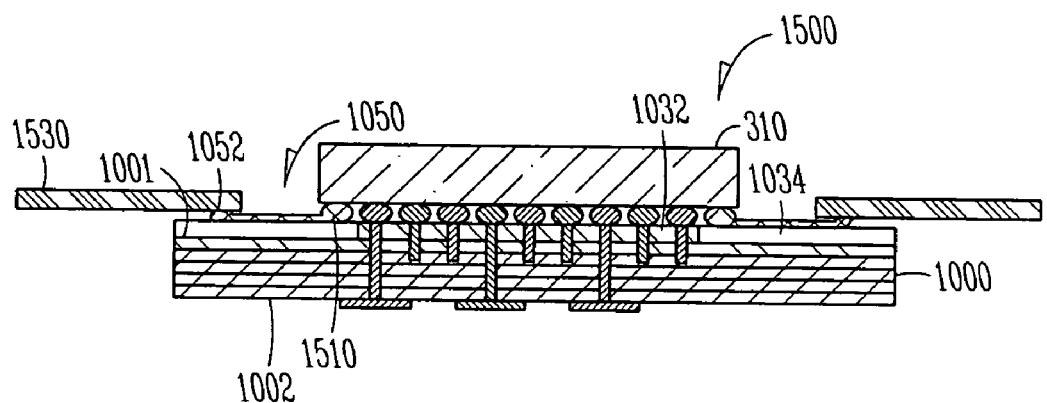
FIG. 15 illustrates a cut-away side view of a die attached to an array capacitor with a flexible substrate connected to the input/output lines, according to example embodiment.
Figure 16:
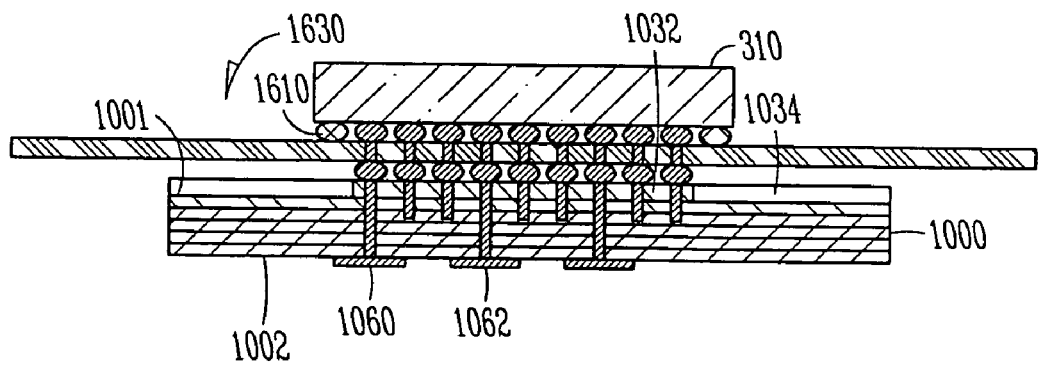
FIG. 16 illustrates a cut-away side view of a die attached to an array capacitor with a flexible substrate connected to the input/output lines, according to example embodiment.
Figure 17:
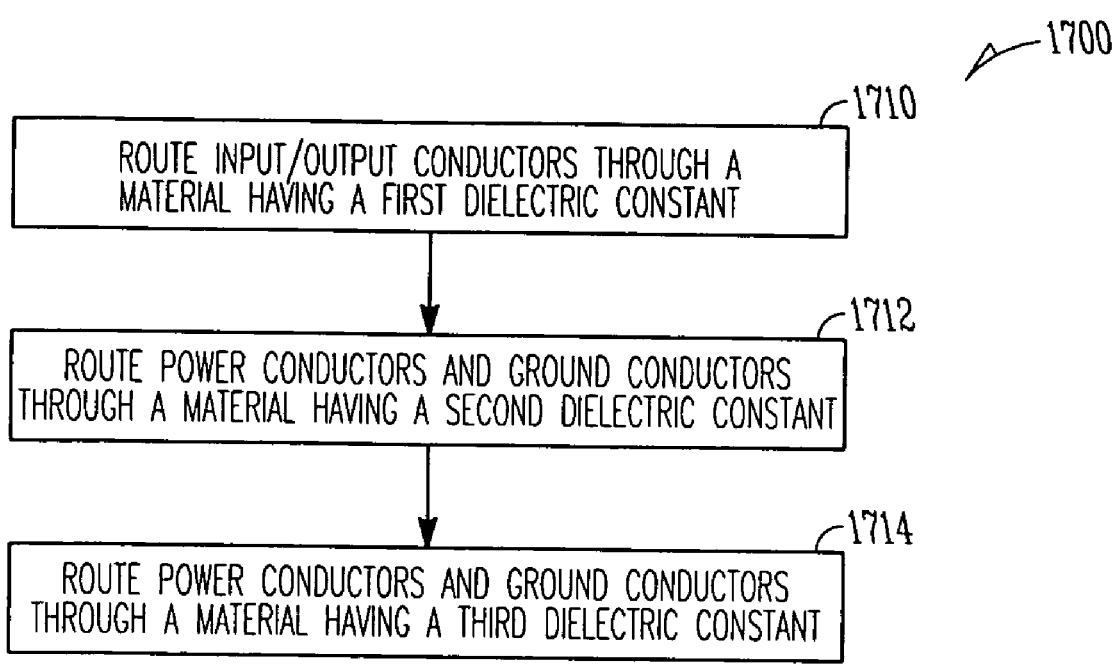
FIG. 17 is a flow diagram of a method for routing conductors through an electronic device, according to an example embodiment.

FIG. 15 illustrates a cutaway side view of a die 310 attached to an array capacitor 1000 with a flexible substrate 1530 attached to an I/O line 1050. The I/O line 1050 includes an I/O pad 1052. The flexible substrate 1530 attaches to the I/O pad 1052. The I/O line provides a conductive path between an I/O bump contact 1510 associated with the die 310 and the I/O pad 1052. Flexible substrate 1530 connects directly to the I/O pad 1052 positioned near the perimeter of the array capacitor 1000. The flexible substrate 1530 includes a low K material to prevent transmission or conductance between the conductors carrying the I/O signal from the I/O pad 1052 and other nearby conductors carrying either power connected to ground or carrying other signals to and from the die 310 associated with a package 1500. As mentioned previously, the power and ground connections are capacitively coupled by the high K material 1032 on the surface of the array capacitor 1000. The high K material may include a thin film capacitor. In addition, the power and ground connections are capacitively coupled within the array capacitor 1000. The array capacitor 1000 is yet another high K material. The various plates associated with the array capacitor 1000 (structure detailed and discussion of FIG. 10) enhance the capacitive coupling between the power and ground connectors. FIG. 16 illustrates a cutaway side view of a die 310 attached to an array capacitor 1000 with a flexible substrate 1630 attached to the die 310. Specifically, the die 310 includes an electrical contact or solder bump 1610 that carries I/O signals to and from the die. The flexible substrate 1630 includes a low K material. The flexible substrate 1630 also includes a conductive path through the flexible substrate 1630 and away from the die 310 to a device which uses the signal carrier. The die 310 also includes a plurality of power and ground connections, such as power connection 1060 and ground connection 1062. The power and ground connections extend through the flexible substrate 1630 and into the array capacitor 1000. There is sufficient capacitive coupling between the high K material 1032, as well as within the array capacitor 1000, to provide sufficient capacitive coupling between the power and ground connections, such as 1060 and 1062, respectively. As mentioned previously, the array capacitor 1000 is termed a high K material.

It is also contemplated, that the options for flexible substrates shown in FIGS. 14–16 may also be used on an array capacitor 1000 that does not include a thin, high K layer, such as a thin film capacitor, is placed between the array capacitor 1000 and the die 310.

An electronic device includes a material having a first dielectric constant (K) value, and a material having a second dielectric constant (K) value. The first dielectric constant (k) value is lower than the second dielectric constant (K) value. The electronic device also includes input/output connection conductors 610, 710, 810, 910 for transmitting signals to and from the die 310 (such as shown in FIGS. 6–9). The input/output connection conductors 610, 710, 810, 910 are routed through the material 521 of the interposer 310 having the first dielectric constant (shown in FIGS. 6 and 7). The electronic device also includes power connection conductors 550 for delivering power to the die, and ground connection conductors 560 (as shown in FIG. 5). The power and ground connection conductors, 550, 560, respectively, are routed through the material 324 having the second dielectric constant(as shown in FIG. 5). In some embodiments, the electronic device is adapted to connect to a die 310 (as shown in FIGS. 6–9). In other embodiments, the electronic device is adapted to connect to a package substrate.

In still other embodiments, the electronic device includes connectors adapted to electrically couple to a die, and connectors adapted to electrically couple to a package substrate. In still other embodiments, the electronic device further includes a material having a third dielectric constant (K) value. The material having the third dielectric constant may include a substrate that includes an array capacitor, a layer of one material placed on the surface of the array capacitor or a layer of another material placed on the surface of an array capacitor. The first dielectric constant (K) value is lower than the third dielectric constant (K) value and the power and ground connection conductors are routed through the material having the third dielectric constant. In some embodiments, the third dielectric constant value is substantially equal to the second dielectric constant. The material having the first dielectric constant value can be glass or silicon, and the material having the second dielectric constant value is a thin film capacitor or an array capacitor. In some embodiments, the material having the second dielectric constant value can be a thin film capacitor and the material having the third dielectric constant value is an array capacitor. The electronic device can also include socket contacts or ball contacts.

A method 1700 for routing conductors through an electronic device includes routing input/output conductors through a material having a first dielectric constant, 1710 and routing power conductors and ground conductors through a material having a second dielectric constant 1712. The first dielectric constant has a value lower that the second dielectric constant. The method also includes routing power conductors and ground conductors through a material having a third dielectric constant 1714. The first dielectric constant has a value lower than the third dielectric constant. In some embodiments, the third dielectric constant has a value substantially equal to the second dielectric constant.

Figure 18:
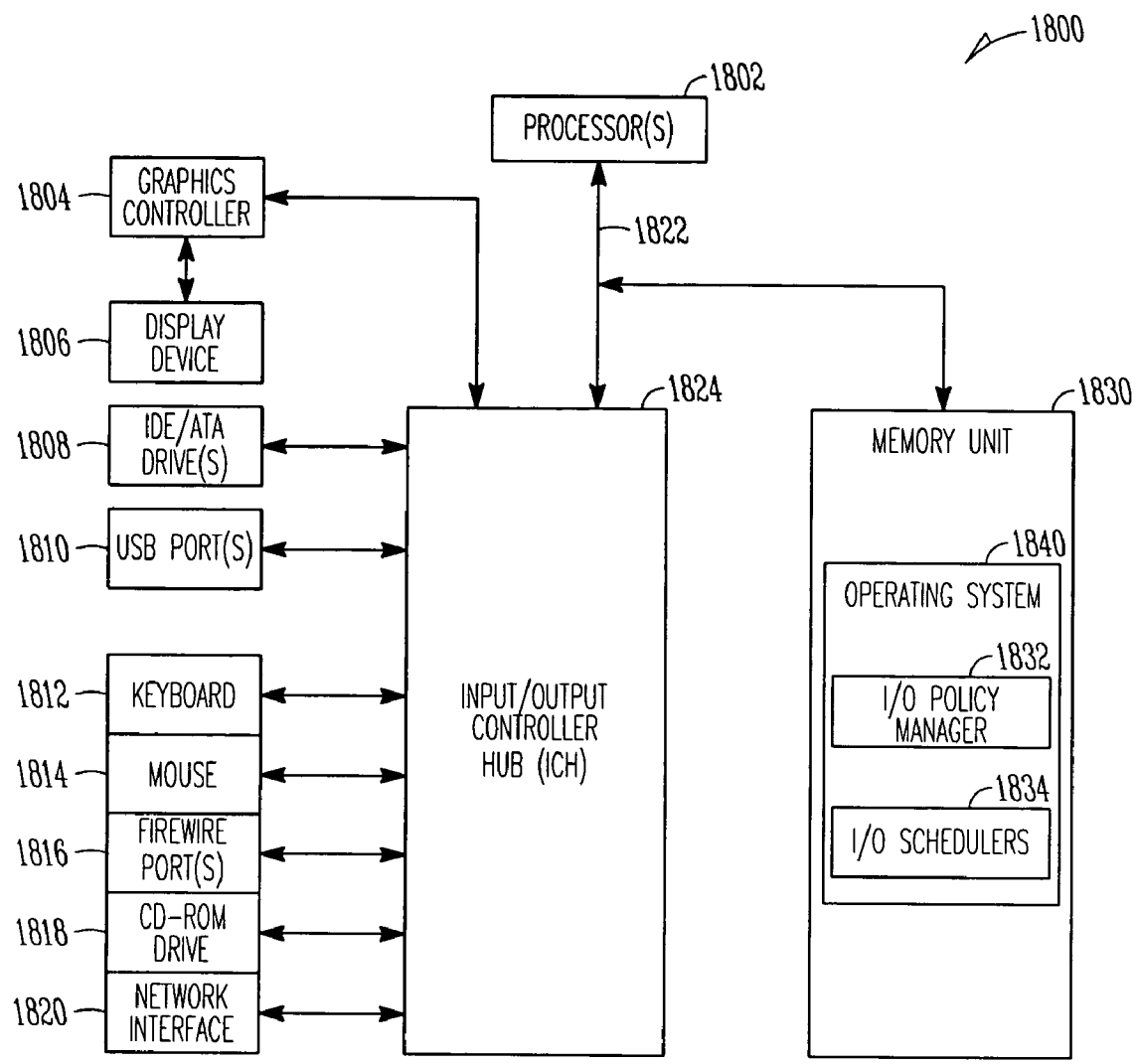
FIG. 18 is a schematic diagram of a computer system used using certain example embodiments.

FIG. 18 illustrates an example computer system used in conjunction with certain embodiments of the invention. As illustrated in FIG. 18, computer system 1800 comprises processor(s) 1802. The computer system 1800 also includes a memory unit 1830, processor bus 1822, and Input/Output controller hub (ICH) 1824. The processor(s) 1802, memory unit 1830, and ICH 1824 are coupled to the processor bus 1822. The processor(s) 1802 may comprise any suitable processor architecture. The computer system 1800 may comprise one, two, three, or more processors, any of which may execute a set of instructions.

The memory unit 1830 includes an operating system 1840, which includes an I/O scheduling policy manager 1832 and I/O schedulers 1834. The memory unit 1830 stores data and/or instructions, and may comprise any suitable memory, such as a dynamic random access memory (DRAM), or FLASH memory, for example. The computer system 1800 also includes IDE drive(s) 1808 and/or other suitable storage devices. A graphics controller 1804 controls the display of information on a display device 1806, according to embodiments of the invention.

The Input/Output controller hub (ICH) 1824 provides an interface to I/O devices or peripheral components for the computer system 1800. The ICH 1824 may comprise any suitable interface controller to provide for any suitable communication link to the processor(s) 1802, memory unit 1830 and/or to any suitable device or component in communication with the ICH 1824. For one embodiment of the invention, the ICH 1824 provides suitable arbitration and buffering for each interface.

For one embodiment of the invention, the ICH 1824 provides an interface to one or more suitable integrated drive electronics (IDE) drives 1808, such as a hard disk drive (HDD) or compact disc read-only memory (CD ROM) drive, or to suitable universal serial bus (USB) devices through one or more USB ports 1810. For one embodiment, the ICH 1824 also provides an interface to a keyboard 1812, a mouse 1814, a CD-ROM drive 1818, and one or more suitable devices through one or more firewire ports 1816. The ICH 1824 also provides a network interface 1820 though which the computer system 1800 can communicate with other computers and/or devices on a computer network 1840. The network interface couples the network 1840 to the computer system 1800 via a link 1842. The link 1842 can include a hard wire coupling or a wireless, or both. The computer system 1800 can be any type of computer such as a desktop, server or hand-held device coupled to any type of computer network. Uses of the example embodiments described above include use as a processor 1802 in a desktop, a server, or a mobile type computer system 1800. The processor 1802 could be a microprocessor. The example embodiments described above could be used as a chipset, in a handheld device such as a cell phone or PDA's. The circuit board 100 (see FIG. 1) can be a printed circuit board or the like and can include substantially all of the computer system 1800 or parts of the computer system.

In one embodiment, the computer system 1800 includes a machine-readable medium that stores a set of instructions (e.g., software) for controlling the computer system 1800 and sending or receiving information to or from the network 1840. The set of instructions (software) can reside, completely or at least partially, within memory unit 1830 and/or within the processor(s) 1802.

Thus, a system, method, and machine-readable medium including instructions for Input/Output scheduling have been described. Although the present invention has been described with reference to specific example embodiments, it will be evident that various modifications and changes may be made to these embodiments without departing from the broader spirit and scope of the disclosed subject matter. Accordingly, the specification and drawings are to be regarded in an illustrative rather than a restrictive sense.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A package for an electronic device comprising:
    an interposer further comprising:
        a main body:
        a material having a first dielectric constant (K) value; and
        a material having a second dielectric constant (K) value, wherein the first dielectric constant (K) value is lower than the second dielectric constant (K) value, the material having the first dielectric constant (K) value, and the material having a second dielectric constant (K) value, within a layer attached to the main body;
    a die attached to the interposer, the die further comprising;
    input/output lines for transmitting signals to and from the die, the input/output lines routed through the material having the first dielectric constant; and
    power and ground connections routed through and in direct contact with the material having the second dielectric constant.

2. The package of claim 1 wherein the material having the second dielectric constant (K) is a thin film capacitor.

3. The package of claim 2 wherein the main body includes a ceramic array capacitor.

4. The package of claim 1 wherein the main body is a ceramic array capacitor.

5. The package of claim 1 wherein the material having the second dielectric constant (K) is positioned adjacent the active surface of the die.

6. The package of claim 1 wherein the material having the second dielectric constant (K) is positioned along at least a portion of the periphery of the die.

7. The package of claim 1 wherein the material having the first dielectric constant (K) is silicon oxide.

8. The package of claim 1 wherein the material having the first dielectric constant (K) is glass.

9. The package of claim 1 further comprising a package substrate, wherein the interposer is attached to the package substrate.

10. The package of claim 1 further comprising:
    a package substrate; and
    a flexible substrate, wherein the interposer is attached to the package substrate and the flexible substrate.

11. An electronic device comprising:
    a main body:
    a material having a first dielectric constant (K) value; and
    a material having a second dielectric constant (K) value, wherein the first dielectric constant (K) value is lower than the second dielectric constant (K) value, the material having the first dielectric constant (K) value and the material having the second dielectric constant (K) value being located in a separate layer associated with the main body;
    input/output connection conductors for transmitting signals to and from a die, the input/output connection conductors routed through the material of the interposer having the first dielectric constant;
    power connection conductors for delivering power to the die; and
    ground connection conductors, the power and ground connection conductors routed through and in direct contact with the material having the second dielectric constant.

12. The electronic device of claim 11 adapted to connect to a die.

13. The electronic device of claim 11 adapted to connect to a package substrate.

14. The electronic device of claim 11 further comprising:
    connectors adapted to electrically couple to a die; and connectors adapted to electrically couple to a package substrate.

15. The electronic device of claim 11 wherein the main body comprises a material having a third dielectric constant (K) value, wherein the first dielectric constant (K) value is lower than a third dielectric constant (K) value, and wherein the power and ground connection conductors are routed through the material having the third dielectric constant.

16. The electronic device of claim 15 wherein the third dielectric constant value is substantially equal to the second dielectric constant.

17. The electronic device of claim 11 wherein the material having the first dielectric constant value is glass.

18. The electronic device of claim 11 wherein the material having the first dielectric constant value includes silicon oxide.

19. The electronic device of claim 11 wherein the material having the second dielectric constant value is a thin film capacitor.

20. The electronic device of claim 11 wherein the material having the second dielectric constant value is an array capacitor.

21. The electronic device of claim 11 wherein the material having the second dielectric constant value is a thin film capacitor and wherein the material having the third dielectric constant value is an array capacitor.

22. The electronic device of claim 11 further comprising socket contacts.

23. The electronic device of claim 11 further comprising ball contacts.

24. A package for an electronic device comprising:
an interposer further comprising
  a main body;
  a material having a first dielectric constant (K) value;
  a material having a second dielectric constant (K) value, wherein the first dielectric constant (K) value is lower than the second dielectric constant (K) value, the material having the first dielectric constant (K) value, and the material having a second dielectric constant (K) value, within a separate layer attached to the mainbody;
  input/output lines for transmitting signals to and from a die, the input/output lines routed through the material having the first dielectric constant; and
  power and ground connections routed through and in direct contact with the material having the second dielectric constant;
the die communicatively coupled to the interposer; and
a package substrate, the interposer communicatively coupled to the package substrate.

25. The package of claim 24 wherein the material having the first dielectric constant (K) value substantially prevents cross talk between conductors routed through the material.

26. The package of claim 24 wherein the material having the second dielectric constant (K) value provides for capacitive coupling between the conductors carrying power and the conductors connecting to ground.

27. An electronic system comprising:
a main body;
a material having a first dielectric constant (K) value; and
a material having a second dielectric constant (K) value, wherein the first dielectric constant (K) value is lower than the second dielectric constant (K) value, the material having the first dielectric constant (K) value, and the material having a second dielectric constant (K) value, within a separate layer attached to the main body;
input/output connection conductors for transmitting signals to and from a die, the input/output connection conductors routed through the material of an interposer having the first dielectric constant;
power connection conductors for delivering power to the die;
ground connection conductors, the power and ground connection conductors routed through and in direct contact with the material having the second dielectric constant, and
a plurality of connectors to a buss associated with at least one of the input/output connection conductors, the power connection conductor, and the ground connection conductor.

28. The electronic system of claim 27 adapted to connect to a die.

29. The electronic system of claim 27 adapted to connect to a package substrate.

30. The package for an electronic device of claim 1 wherein the layer attached with the main body is made of a material that differs from the material having a first dielectric constant (K) value, and the material having a second dielectric constant (K) value.

31. The package for an electronic device of claim 1 wherein the main body includes:
a first major surface; and
a second major surface, the layer associated with the main body attached to one of the first major surface or the second major surface by way of an isolation layer.

* * * * *

UNITED STATES PATENT AND TRADEMARK OFFICE
CERTIFICATE OF CORRECTION

| | | |
|---|---|---|
| PATENT NO. | : 7,176,575 B2 | Page 1 of 1 |
| APPLICATION NO. | : 10/955944 | |
| DATED | : February 13, 2007 | |
| INVENTOR(S) | : Mosley et al. | |

It is certified that error appears in the above-identified patent and that said Letters Patent is hereby corrected as shown below:

In column 12, line 4, in Claim 1, after "body" delete ":" and insert -- ; --, therefor.

In column 12, line 43, in Claim 11, after "body" delete ":" and insert -- ; --, therefor.

In column 13, line 33, in Claim 24, after "body" delete ":" and insert -- ; --, therefor.

Signed and Sealed this

Twenty-fourth Day of April, 2007

JON W. DUDAS
*Director of the United States Patent and Trademark Office*